United States Patent
Li

(10) Patent No.: US 10,649,841 B2
(45) Date of Patent: May 12, 2020

(54) SUPPORTING MULTIPLE PAGE LENGTHS WITH UNIQUE ERROR CORRECTION CODING VIA GALOIS FIELD DIMENSION FOLDING

(71) Applicant: Alibaba Group Holding Limited, Grand Cayman (KY)

(72) Inventor: Shu Li, Santa Clara, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 136 days.

(21) Appl. No.: 15/911,819

(22) Filed: Mar. 5, 2018

(65) Prior Publication Data

US 2019/0272212 A1    Sep. 5, 2019

(51) Int. Cl.
| G06F 12/00 | (2006.01) |
| G06F 11/10 | (2006.01) |
| H03M 13/11 | (2006.01) |
| G06F 3/06  | (2006.01) |
| G06F 12/02 | (2006.01) |
| H03M 13/29 | (2006.01) |

(52) U.S. Cl.
CPC ............ *G06F 11/10* (2013.01); *G06F 3/0613* (2013.01); *G06F 12/0246* (2013.01); *H03M 13/118* (2013.01); *H03M 13/1171* (2013.01); *H03M 13/2906* (2013.01); *G06F 3/0679* (2013.01)

(58) Field of Classification Search
CPC .... G06F 11/10; G06F 12/0246; G06F 3/0613; G06F 3/0679; H03M 13/118
USPC ........................................................ 711/200
See application file for complete search history.

(56) References Cited

U.S. PATENT DOCUMENTS

| 4,847,801 A | 7/1989 | Tong |
| 6,366,941 B1 | 4/2002 | Wolf et al. |
| 6,721,919 B1 | 4/2004 | Morioka et al. |
| 6,760,742 B1 | 7/2004 | Hoyle |
| 7,995,757 B2 | 8/2011 | Michaels et al. |
| 7,996,746 B2 | 8/2011 | Livshitz et al. |
| 8,099,655 B1 | 1/2012 | Tan et al. |
| 8,108,760 B2 | 1/2012 | Gross et al. |
| 8,656,244 B1 | 2/2014 | Chang |
| 8,972,834 B2 | 3/2015 | Eroz et al. |
| 9,208,018 B1 * | 12/2015 | Northcott ............ G06F 11/1008 |
| 9,619,207 B1 | 4/2017 | Langhammer |

(Continued)

OTHER PUBLICATIONS

International Search Report and Written Opinion to corresponding International Application No. PCT/US19/19068 dated May 14, 2019 (6 pages).

*Primary Examiner* — Mardochee Chery
(74) *Attorney, Agent, or Firm* — James J. DeCarlo; Greenberg Traurig, LLP

(57) ABSTRACT

Disclosed are methods and devices for supporting multiple page lengths with unique error correction coding via Galois field dimension folding. In one embodiment, a method comprises receiving a write instruction, the write instruction including user data; generating extended user data based on the user data, the extended user data including at least one symbol comprising a bit of the user data and a pre-stored bit pattern; generating parity data by encoding the extended user data; generating parity extension data by encoding the bit of the user data; writing a codeword to a page of a non-volatile memory device, the codeword including the parity extension data, the user data, and the parity data.

22 Claims, 10 Drawing Sheets

(56) References Cited

U.S. PATENT DOCUMENTS

| | | |
|---|---|---|
| 9,740,456 B2 | 8/2017 | Chu |
| 2004/0078411 A1 | 4/2004 | Porten et al. |
| 2006/0195768 A1 | 8/2006 | Hassner et al. |
| 2008/0256425 A1 | 10/2008 | Oh et al. |
| 2009/0199075 A1 | 8/2009 | Demjanenko et al. |
| 2017/0242747 A1 | 8/2017 | He et al. |
| 2017/0255512 A1 | 9/2017 | Zamir et al. |
| 2017/0315781 A1 | 11/2017 | Chu |

* cited by examiner

SUPPORTING MULTIPLE PAGE LENGTHS WITH UNIQUE ERROR CORRECTION CODING VIA GALOIS FIELD DIMENSION FOLDING

COPYRIGHT NOTICE

This application includes material that may be subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

The disclosed embodiments relate to NAND Flash memory and, more specifically, to systems and methods for enabling variable-length NAND Flash pages.

A fundamental and readable unit of NAND Flash solid-state drive (SSD) devices is the "sector" or "page." SSDs store all data on a number of pages arranged within multiple logical layers of the SSD. Early, and current, traditional solid-state drive (SSD) devices utilized fixed sector sizes of 512 bytes or 4096 bytes (4 KB). More recently, SSDs have supported "variable sector sizes." A variable sector size refers to supporting sector sizes beyond standard 512B and 4 KB sector sizes including random sector sizes. Advances in computer architecture, such as the proliferation of NVM Express (NVMe) devices, have resulted in many options of sector sizes including 520, 528, 4104, 4160, and 4224-byte page sizes. Variable sector sizes are designed to allow users and applications to insert additional management information together with actual data stored on SSDs in each sector.

The need to store additional data in sectors arises due to the fundamental characteristics of NAND Flash memory. Specifically, management data for a given page is ideally stored in a region of the page so that the management data can be read along with the page, eliminating multiple reads. Additionally, the logical block address (LBA) of each sector is stored as management data in the sector, usually in an out-of-band (OOB) region of the sector. LBA data is stored within a sector so that the LBA to physical block address (PBA) mapping can be re-built by reading content of individual sectors.

The use of variable page sizes results in the use of varying error correction code (ECC) and cyclical redundancy check (CRC) mechanisms. The requirement that multiple ECC and CRC mechanisms be used increase the overhead required by a NAND Flash controller.

Additionally, NAND Flash fabrication increasingly "stacks" multiple chips within a single package in order to increase the density of the package while retaining a smaller form factor. While these three-dimensional stacking techniques improve the capacity of the NAND Flash package, the proximity of chips drastically increases the noise present on the channel as well as varies access time to data within the NAND Flash package. The increase in noise results in higher levels of ECC and CRC redundancy needed to both detect and, if possible, correct errors within the package data.

Further, the increase in program and erase ("P/E") cycles results in a higher error rate due to the nature of NAND Flash circuitry. Specifically, each P/E cycle reduces the integrity of the underlying transistors in the NAND Flash package, resulting in a higher level of noise (and, thus, a higher redundancy of ECC and CRC bits).

In general, current systems handle this increased noise by providing stronger error correction schemes on the fly. This technique, however, requires that the error correction circuitry switch to a lower code rate in order to provide strong fault tolerance. This decreasing of code rate results in lower throughput of the NAND Flash package. Thus, current systems result in degraded NAND Flash performance over time due to the combination of variable page sizes, three-dimensional stacking, and higher P/E cycles.

BRIEF SUMMARY

As discussed above, variable page sizes, three-dimensional stacking, and higher P/E cycles are desired characteristics of a NAND Flash package. However, the current error correction techniques utilized to support these features degrade the performance of the package. The disclosed embodiments provide solutions for providing variable page sizes in NAND Flash without the degraded performance of current systems.

In general, the disclosed embodiments describe techniques for providing bit-level granularity of NAND Flash page sizes. Additionally, the disclosed embodiments describe techniques for utilizing a single error correction code throughout the lifespan of a NAND Flash package.

In one embodiment, a method comprises receiving a write instruction, the write instruction including user data; generating extended user data based on the user data, the extended user data including at least one symbol comprising a bit of the user data and a pre-stored bit pattern; generating parity data by encoding the extended user data; generating parity extension data by encoding the bit of the user data; writing a codeword to a page of a non-volatile memory device, the codeword including the parity extension data, the user data, and the parity data.

In another embodiment, a method is disclosed comprising retrieving a codeword from a non-volatile memory device in response to a read instruction; identifying an extended symbol included in the codeword; hard decoding the extended symbol to obtain a decoded extended symbol; freezing the decoded extended symbol and setting a maximum confidence for the decoded extended symbol; generating a decoded codeword by performing a parity check of the codeword using a partial parity check matrix, the parity check comprising an iterative soft-decision decoding process; and generating decoded user data by dropping one or more inserted bits from the decoded codeword.

In another embodiment, a device is disclosed comprising a processor; and a storage medium for tangibly storing thereon program logic for execution by the processor, the stored program logic comprising: logic, executed by the processor, for receiving a write instruction, the write instruction including user data; logic, executed by the processor, for generating extended user data based on the user data, the extended user data including at least one symbol comprising a bit of the user data and a pre-stored bit pattern; logic, executed by the processor, for generating parity data by encoding the extended user data; logic, executed by the processor, for generating parity extension data by encoding the bit of the user data; logic, executed by the processor, for writing a codeword to a non-volatile memory device, the codeword including the parity extension data, the user data, and the parity data.

BRIEF DESCRIPTION OF THE FIGURES

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1:
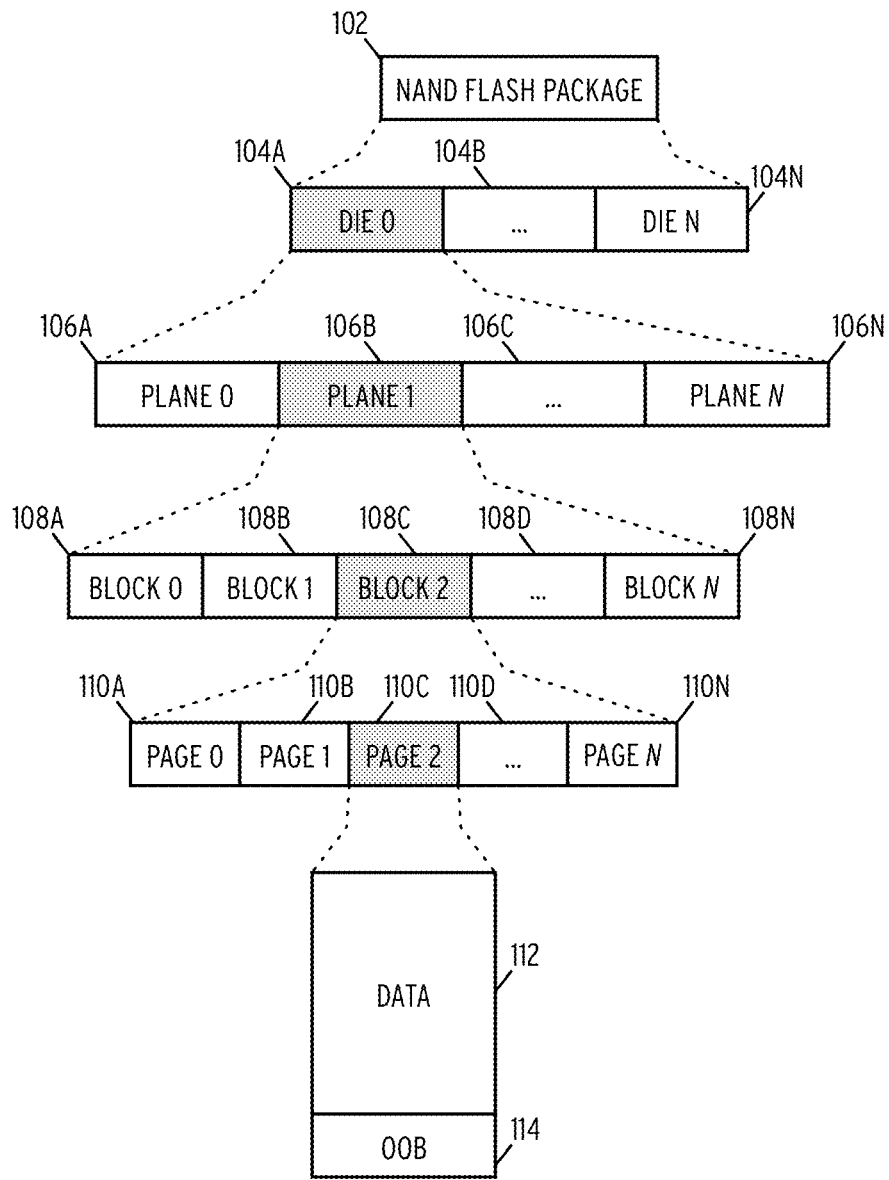
FIG. 1 is a logical diagram illustrating the layout of a NAND Flash package according to some embodiments of the disclosure.

The present disclosure will now be described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

FIG. 1 is a logical diagram illustrating the layout of a NAND Flash package according to some embodiments of the disclosure.

NAND Flash package (102) comprises a memory device. In some embodiments, NAND Flash package (102) comprises a memory chip used, for example, in a solid-state storage device (SSD). SSD devices comprise devices used as hard disks, portable storage drives, and other uses. NAND Flash package (102) represents the highest level of organization of a Flash storage device. In some embodiments, SSDs include multiple NAND Flash packages configured on a single circuit board, substrate, or other connective device.

The highest level of organization NAND Flash package (102) is a die, as illustrated in FIG. 1 as dies (104A, 104B, 104N). The number of dies in a NAND Flash package (102) may be any number suitable for the operation of NAND Flash package (102). In common scenarios, a NAND Flash package will include one, two, or four devices. While any number of dies may be used, the number of dies is generally a power of two. A given die (104A) is the smallest unit that may execute commands independently.

A given die (104A) includes one or more planes (106A, 106B, 106C, and 106N). In practice, a die includes one or two planes; however the number of planes is not explicitly limited to one or two planes. In general, concurrent operations may be executed at the plane-level.

Each plane (106A, 106B, 106C, and 106N) includes one or more blocks. For example, as illustrated, plane (106B) includes blocks (108A, 108B, 108C, 108D, and 108N). In general, the number of blocks is limited by the plane size as well as a defined block size (e.g., 4 MB or 8 MB). A block (e.g., 108A) is the smallest unit of data that may be erased.

Each block includes a number of pages. For example, as illustrated, block 108C includes pages (110A, 110B, 110C, 110D, 110N). As with blocks, the number of blocks is limited by the plane size as well as a defined block size (e.g., 8 KB or 16 KB). A page is the smallest unit that may be written two. Combined with the block-level erasure constraint, in order to "erase" a page, the entire underlying block must be erased, thus requiring that other pages in the block be "saved" before erasing the block, and thus page.

A given page (e.g., page 110C), includes a data portion (112) and an out-of-band region (114). The data portion (112) includes the user data stored by the NAND Flash package (102) in the respective page. The OOB portion (114) stores various metadata properties of the page, as discussed herein. The OOB portion (114) includes parity bits generated during write operations and used during read operations to detect errors in the user data. In general, the NAND Flash package (102) may utilize various types of linear block encoding schemes to generate the parity bits such as Hamming Codes, Bose, Chaudhuri, and Hocquenghem (BCH) codes, Reed-Solomon codes, turbocodes, or Low Density Parity Codes (LDPC). The OOB portion (114) additionally stores a logical block address (LBA) that identifies the logical location of the page (e.g., 110C) within the package. Storing the LBA in OOB portion (114) allows for an LBA to physical block address (PBA) remapping in the event that an LBA-to-PBA mapping is corrupted or otherwise lost. In general, the LBA-to-PBA mapping is stored separately from the pages themselves and is utilized by a Flash translation layer (FTL) to convert LBAs in, for example, read/write commands to a PBA utilized to extract individual pages. In certain pages (e.g., the first and last pages of a block), the OOB region (114) may additionally include an erase count, erase seal flag, sequence number, and a bad block indicator.

Figure 2:
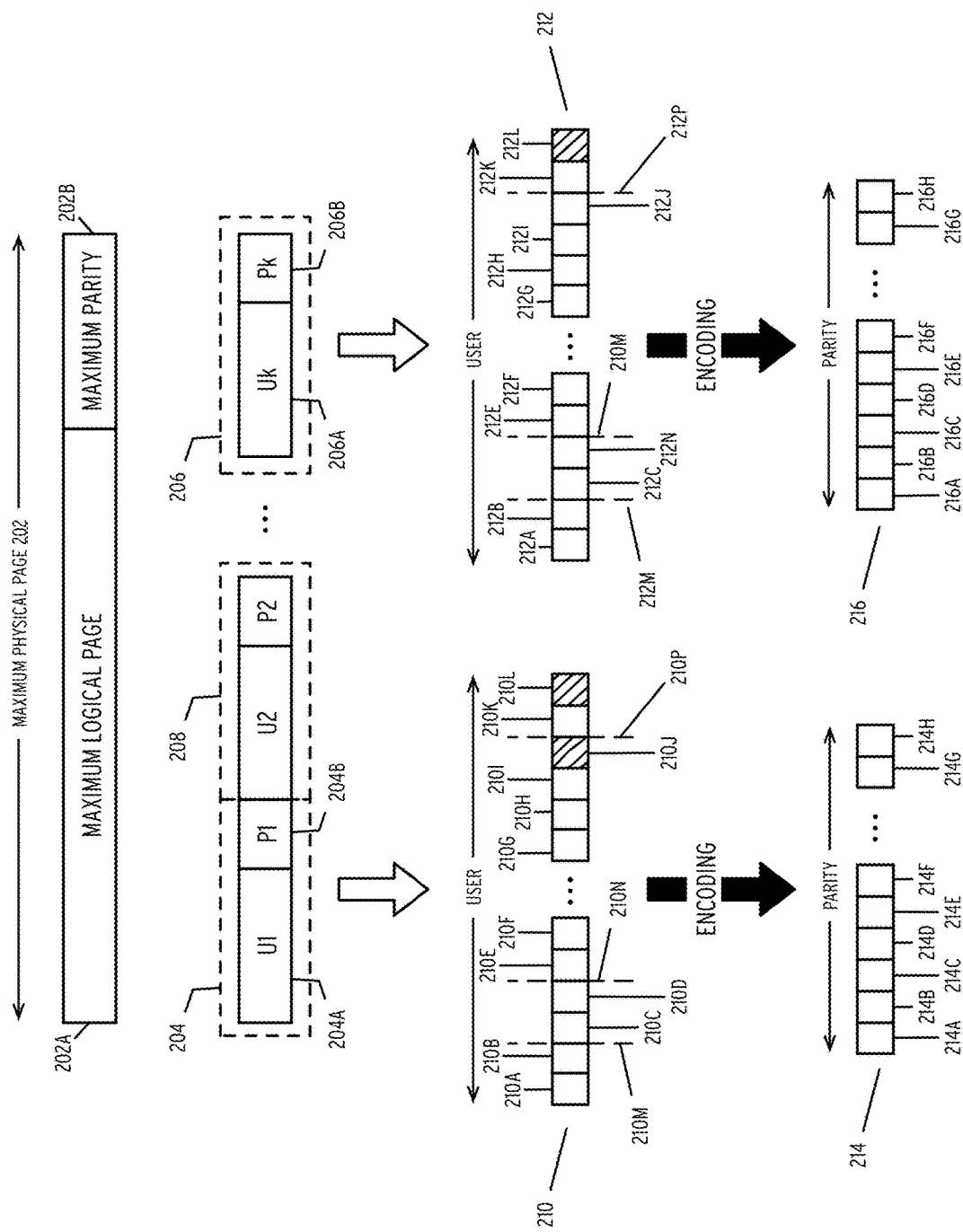
FIG. 2 is a diagram illustrating data placement and protection in a NAND Flash package according to some embodiments of the disclosure.

FIG. 2 is a diagram illustrating data placement and protection in a NAND Flash package according to some embodiments of the disclosure.

As described above, a NAND Flash package includes a plurality of pages (organized into blocks, planes, and dies, discussed above). A page in a given package is associated with a maximum physical length. In some embodiments, the maximum physical length may be specified by the underlying NAND Flash package and may be a function of the physical circuitry of the package.

FIG. 2 illustrates a selected page (202) having a maximum physical size (e.g., 8 KB or 16 KB). A page (202) includes a user data portion and a parity portion (as discussed previously). In the illustrated embodiment, the page (202) includes a maximum logical page (202A) and a maximum parity portion (202B). These portions represent the largest, supported page size when variable page sizes are implemented within a NAND Flash package.

In contrast to existing NAND Flash devices, user data and parity data is segmented and interleaved within a given page (202). As illustrated, multiple tuples (204, 206, 208) of user data (U1 through UK) (e.g., 204A, 206A) and parity data (P1 through PK) (e.g., 204B, 206B) are arranged within a given page. In some embodiments, the total user bits in each tuple equal the maximum logical page size (202A) while the total parity bits in each tuple equal the maximum parity size (202B). In one embodiment, the total user bits and total parity bits may be less than the maximum logical page size (202A) and maximum parity portion (202B), respectively. In some embodiments, the total user bits and total parity bits may not exceed the maximum logical page size (202A) and maximum parity portion (202B). In some embodiments, each item of user data (e.g., 204A and 206A) may be identically sized and each item of parity data (e.g., 204B and 206B) may be identically sized. In other embodiments, these sizes may vary.

FIG. 2 additionally illustrates bit-level representations (210, 212) of user data (204A, 206A), respectively. As illustrated, each item of user data includes a number of bits (e.g., bits 210A-210L and bits 212A-L). In one embodiment, some bits comprise pre-stored bit pattern (210J, 210L, and 212L) comprising, for example, a known bit. In one embodiment, pre-stored bit pattern may be interleaved between user bits when the length of the user data does not fill an entire codeword. For example, in user data (210), the total data in the user data is two bits less than the codeword length. In this embodiment, pre-stored, known bit patterns (210J, 210L) are interleaved at the end of the user data. As another example, the user data in user data (212) is one bit less than the codeword length, thus pre-stored bit 212L is appended to the end of the user data.

In some embodiments, higher order Galois fields (GFs) may be used to encode the data. In the illustrated embodiment, a field GF(4) is used for encoding the user data. Thus, the unit of encoding is equal to two bits as indicated by symbol separators 210M, 210N, 210P and 212M, 212N, and 212P. When using GF(4) symbols, each symbol may be represented as 0, 1, 2, or 3. Using the GF(4) field as an example, bits 210I and 210J form a single symbol and bits 210K and 210L form a second symbol. Since pre-stored bit pattern 210J and 210L are used to lengthen the user data, one bit of the GF symbol is known. The presence of a known bit in a GF symbols is referred to herein as dimensional folding.

Figure 3:
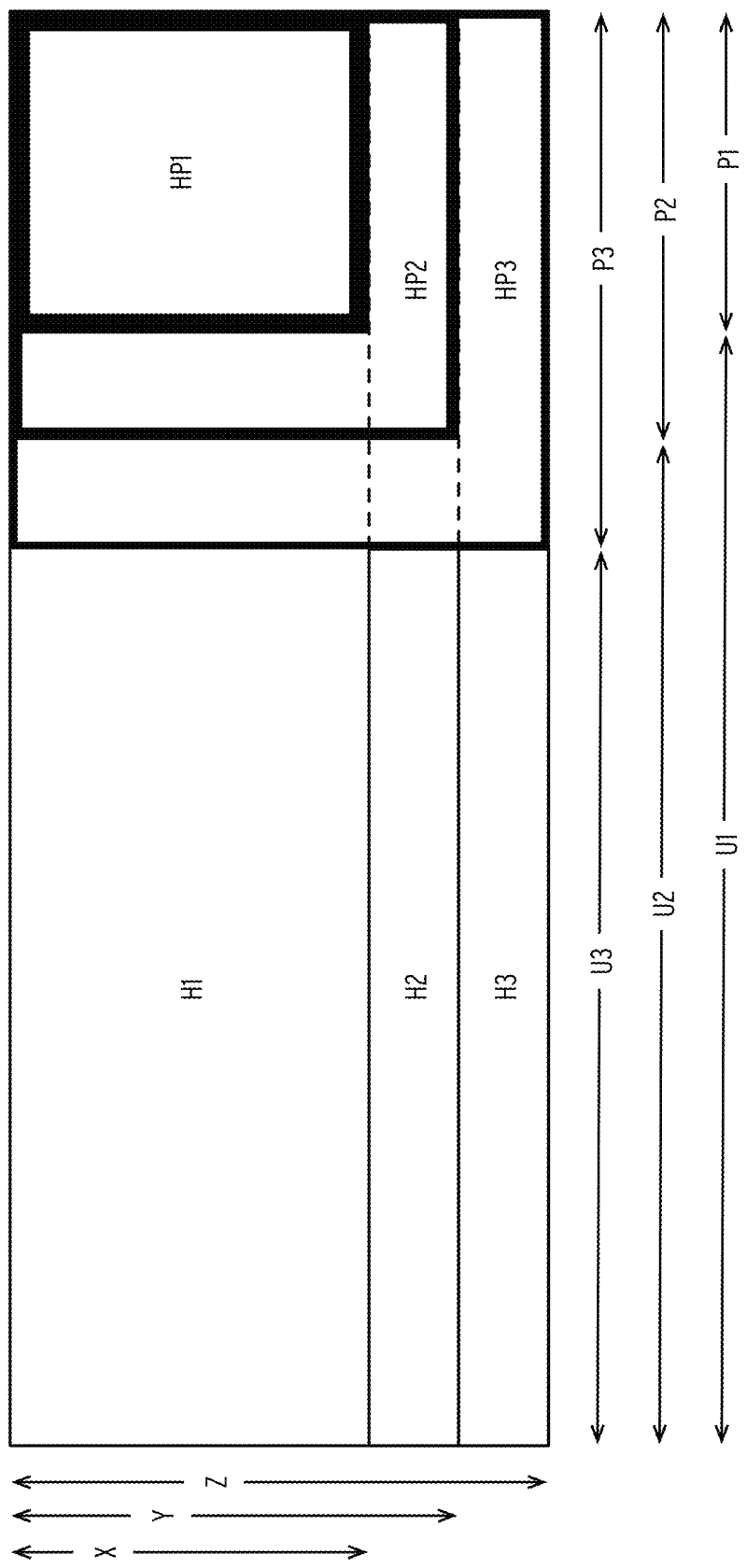
FIG. 3 is a diagram of a parity check matrix according to some embodiments of the disclosure.

FIG. 3 is a diagram of a parity check matrix according to some embodiments of the disclosure.

The matrix includes a full matrix H3 which includes parity submatrix HP3. As illustrated, full matrix H3 includes a parity check matrix having Z rows and U1 +P1 columns. In one embodiment, the full parity check matrix results is utilized with a codeword having a low code rate due to the decreased number of user data bits and the increased number of parity bits.

Matrix H3 includes a submatrix H2 having Y rows and U2 +P2 columns. As illustrated, matrix H2 is a submatrix of H3. Matrix H3 additionally includes a submatrix H1 having X rows and U3+P3 columns. As with submatrix H2, H1 is a submatrix of both H3 and H2. In the illustrated embodiment, the parity submatrix H1 provides the highest code rate given the low number of parity bits and higher number of user data bits.

As discussed above, the single matrix H3 and submatrices may be selected based on the underlying user data to be written to the NAND Flash page. In this manner, only a single matrix (H3) must be generated and used for parity checks and encoding. In general, only a defined number of submatrices may be utilized. In this case, user data that does not match the dimensions of U1, U2, and U3 may be dimensionally folded using pre-stored bit pattern matching known patterns as discussed in connection with FIG. 2.

As will be discussed in more detail, a system may store only the H3 matrix (and, by proxy, the submatrices H2 and H1). During encoding, the system determines the length of the user data and, if needed, dimensionally folds the user data to match a predefined user data length (e.g., U1, U2, and U3). The storage of a single encoding matrix drastically reduces the complexity of a NAND Flash package and reduces the complexity and computational resources needed during encoding. As will be discussed, the availability of a lower code rate matrix builds more connections during belief propagation and allows for stronger error correction when needed.

Figure 4:
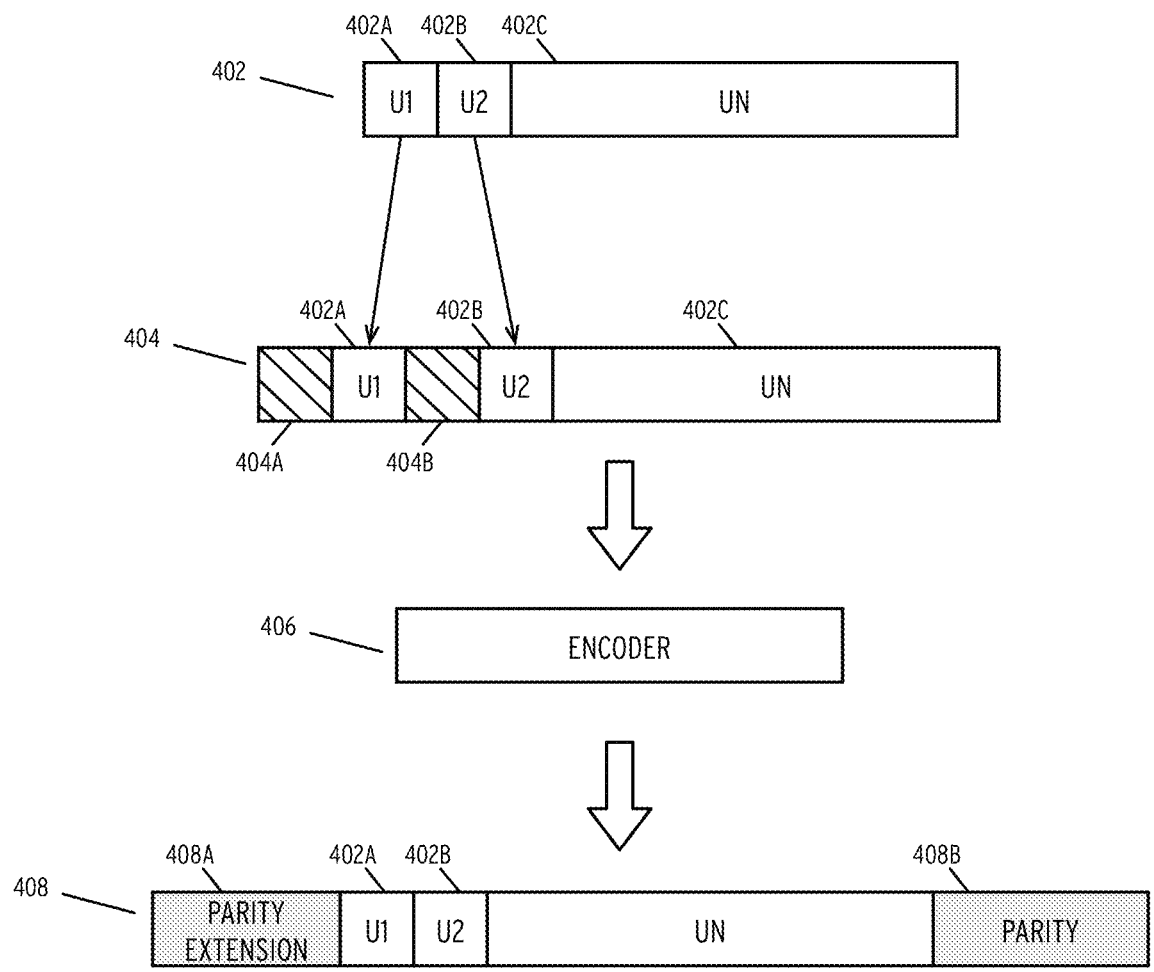
FIG. 4 is a diagram illustrating an encoding procedure for variable-sized data in a NAND Flash memory according to some embodiments of the disclosure.

FIG. 4 is a diagram illustrating an encoding procedure for variable-sized data in a NAND Flash memory according to some embodiments of the disclosure.

User data (402) comprises a plurality of bits including bits (402A, 402B) and remainder bits (402C). In the illustrated embodiment, the total number of bits (402A, 402B, 402C) may be less than a defined variable-size page. In one embodiment, bits (402A, 402B) form a symbol in a GF(4) exemplary finite field As described above, pre-stored bit pattern (404A, 404B) are interleaved with bits (402A, 402B) forming a first symbol (404A, 402A) and a second symbol (404B, 402B). User data (402C) may be likewise segmented into separate symbols provided that user data (402C) is divisible by two.

After interleaving the pre-stored bit pattern (404A, 404B), the extended user data (404) is transmitted to encoder (406) to generate a parity value, and by proxy a fully formed codeword representing the user data.

In one embodiment, the output of encoder (406) is codeword (408). In one embodiment, the parity bits of the encoder are stored in the codeword (408) as parity data (408B). User data (402A-402C) is likewise stored within the codeword (408). Notably, however, pre-stored bit pattern (404A-404B) are not included within the codeword (408). Rather, in some embodiments, the original user bits (402A, 402B) are encoded using a low-rate strong code (e.g., a ½ code). The resulting output of the low-rate code is stored as parity extension (408A). After generating the parity extension (408A), the pre-stored bit pattern (404A-404B) are dropped and not written to the codeword. The resulting space is used to store the parity extension (408).

Figure 5:
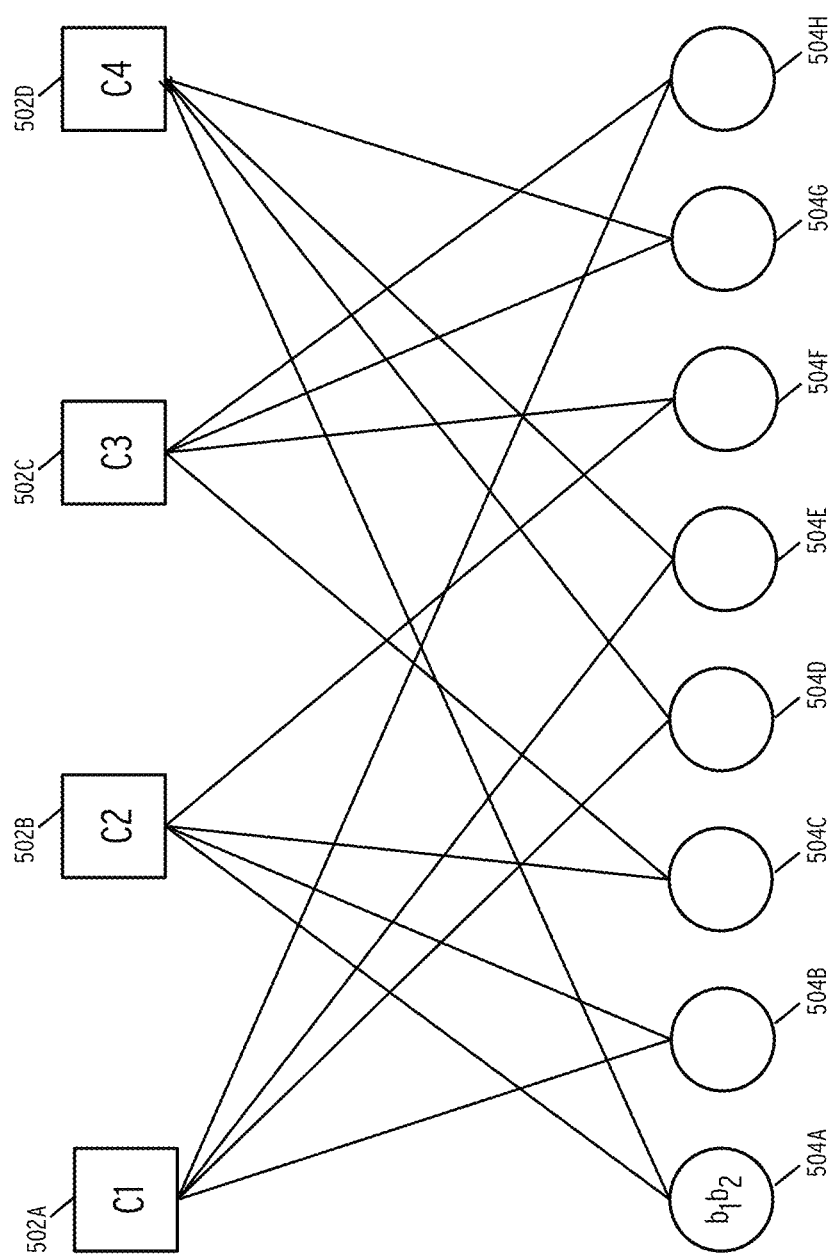
FIG. 5 is a Tanner graph of a message-passing algorithm for generating a parity extension according to some embodiments of the disclosure.

FIG. 5 is a Tanner graph of a message-passing algorithm for generating a parity extension according to some embodiments of the disclosure.

In the illustrated embodiment, the graph represents the matrix (506) used for generating the parity extension discussed previously. Additionally, the illustrated embodiment illustrates the Tanner graph representation of matrix (506) including check nodes (502A-502D) corresponding to the rows of matrix (506) and bit nodes (504A-504H) corresponding to the columns of matrix (506). As known in the art, edges between check nodes (502A-502D) and bit nodes (504A-504H) represent the coefficients included within the matrix (506).

Bit node (504A) illustrates two bits, b1 and b2. In one embodiment, bit b1 corresponds to a user bit and bit b2 corresponds to a pre-stored bit inserted during the encoding process. Together, bits b1 and b2, corresponds to a symbol (e.g., a GF(4) symbol). In one embodiment, only user bits (e.g., b1) are protected via parity extension. As one example, using a GF(4) code, the coefficients (e.g., α, β, and μ) on the edge connecting the check node and the bit node are mapped to be one. In other words, only a geometry connection is utilized in the graph. By utilizing this configuration, a fast encoding and decoding procedure is achieved after dimension folding. Thus, in the illustrated embodiment, only bit b1 from the first bit node (504A) is passed to the connected check nodes (502B, 502D) with edge coefficients of one. A similar process is performed with respect to the remaining check nodes and bit nodes.

Figure 6:
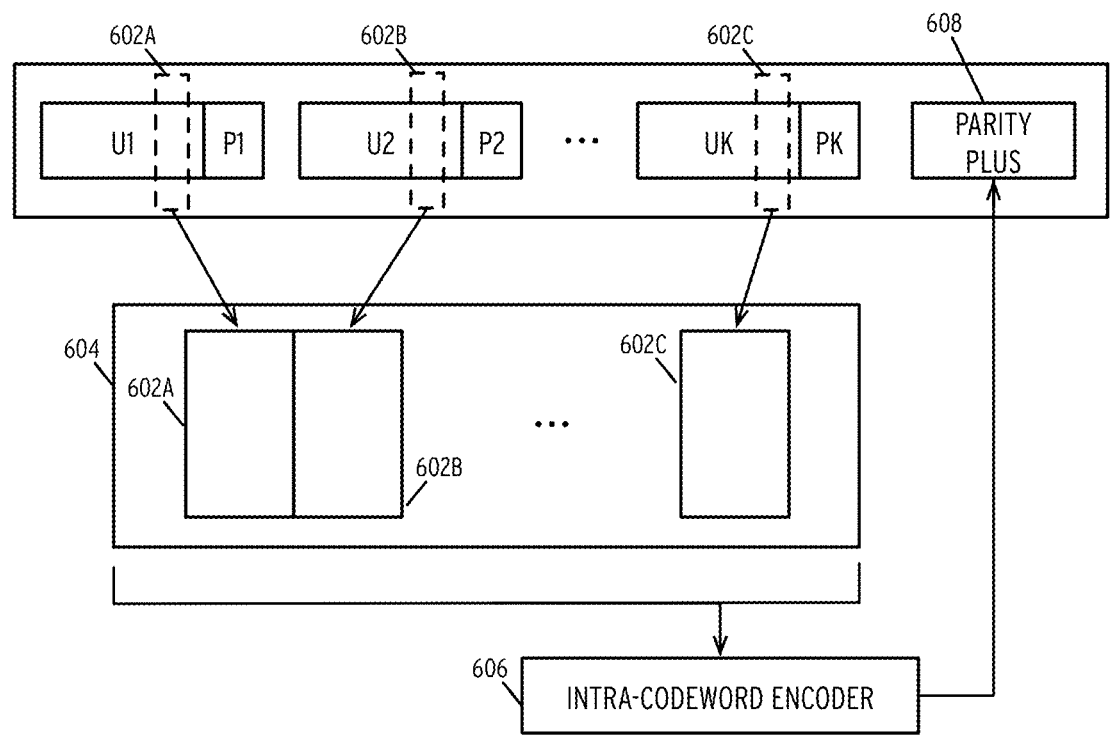
FIG. 6 is a diagram illustrating a method for intra-word encoding to generate additional parity for a NAND Flash page according to some embodiments of the disclosure.

FIG. 6 is a diagram illustrating a method for intra-word encoding to generate additional parity for a NAND Flash page according to some embodiments of the disclosure.

The foregoing description describes techniques for adjusting code rates and extending individual symbols of user data. As illustrated in FIG. 2, multiple codewords are stored within a single NAND Flash page. Thus, there exists a potential for a single NAND Flash page to have one or more "empty" slots for codewords that do not include encoded user data.

In current systems, the NAND Flash package is configured to write "dummy data" (e.g., all ones) to avoid an open word line in the page. However, the writing of this dummy data results in additional wear leveling of the NAND Flash package and shortens the life of the NAND Flash device. Thus, there exists a need to better utilize empty slots versus storing "dummy data" in a given page.

In the illustrated embodiment, a plurality of extended symbols (602A, 602B, 602C) is extracted from user data of multiple codewords stored within a NAND Flash page. The details of generating extended symbols are described previously and are not repeated herein. As discussed, a given symbol may comprise a two-bit symbol for use in a GF(4)-based encoding scheme. In some embodiments, the symbol may comprise a single-bit symbol in a GF(2)-based encoding scheme.

The extended symbols (602A, 602B, 602C) are concatenated to form an extended symbol codeword (604). This codeword (604) is input into an intra-codeword encoder (606). In some embodiments, the intra-codeword encoder (606) may comprise any of the previously discussed encoders. The output of the intra-codeword encoder (606) comprises an additional parity code that is stored as a parity plus data (608) in the empty space of the NAND Flash page.

As illustrated above, the additional parity plus data (608) allows for an additional level of error correction for hardcoded symbols included within user data. Since all data within a given NAND Flash page must be utilized, the use of additional error correction data allows for efficient usage of the underlying space versus the storing of "dummy data" by current systems.

Figure 7:
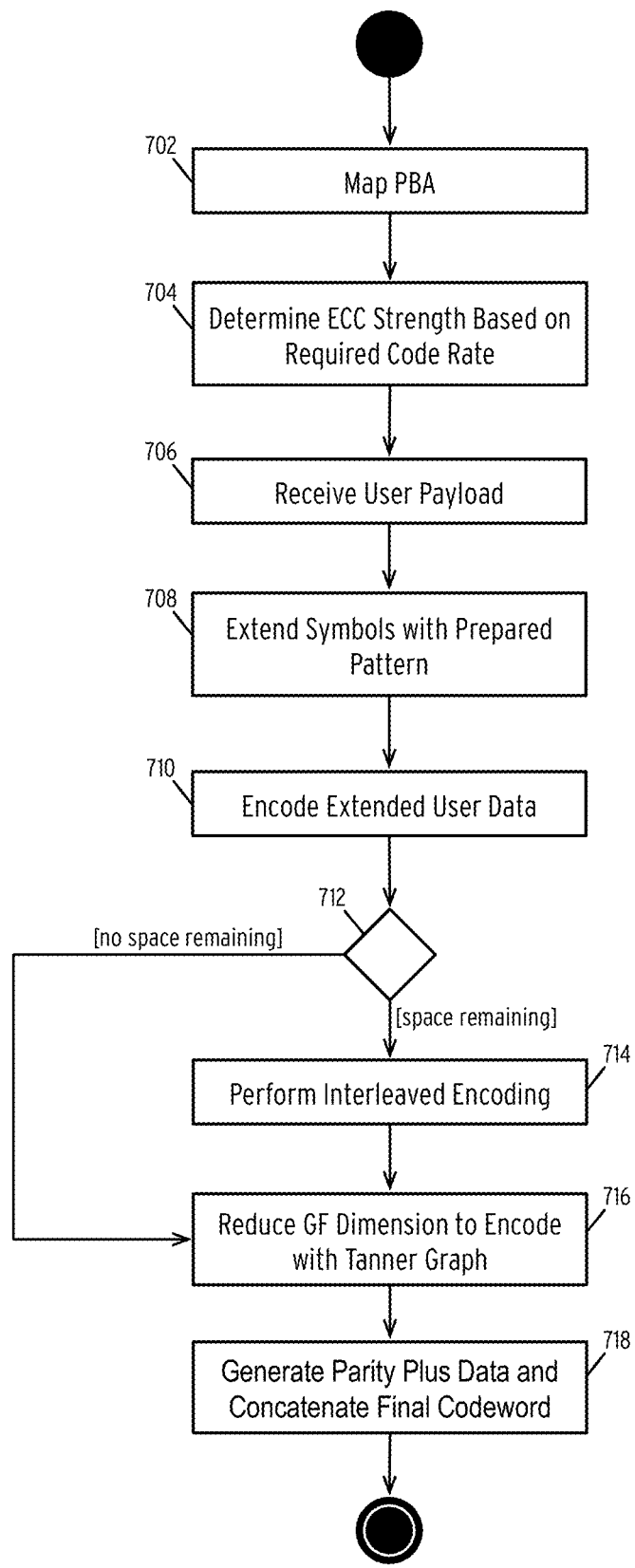
FIG. 7 is a flow diagram illustrating a write operation for a NAND Flash device according to some embodiments of the disclosure.

FIG. 7 is a flow diagram illustrating a write operation for a NAND Flash device according to some embodiments of the disclosure.

In the illustrated embodiment, the method receives a write command including user data and an LBA of a NAND Flash device. In response, the method executes the steps illustrated in FIG. 7. In some embodiments, the illustrated method may be executed by a controller of a NAND Flash device.

In step 702, the method maps the LBA to a corresponding PBA of the NAND Flash device. In some embodiments, the LBA to PBA mapping may be performed by a FTL of a NAND Flash device.

In step 704, the method determines the ECC strength based on the required code rate for the page identified by the PBA.

In one embodiment, the required code rate may be identified by a media management layer of a NAND Flash device. In one embodiment, the code rate may vary based on the size of codewords stored within a given page identified by the PBA. In one embodiment, identifying the ECC strength may comprise identifying an appropriate matrix or submatrix (discussed in FIG. 3) to use for encoding the user data received by the method.

In step 706, the method receives a user payload. In one embodiment, receiving a user payload comprises receiving bits of user data included within a write command received by the method.

In step 708, the method extends symbols within the user payload with a prepared pattern.

As described in the description of FIGS. 2 and 4 (incorporated by reference), the received user payload may include fewer bits than the corresponding codeword length. In this scenario, the method extends individual symbols with pre-stored bit pattern to generate extended user data that matches the length of the user data of a codeword in a given NAND Flash page. In one embodiment, the method extends a plurality of bits in the total bits included within the user data. In one embodiment, the method utilizes a GF(4) dimensional folding scheme to extend a prepared pattern of bits as described more fully in connection with FIGS. 2 and 4.

In step 710, the method encodes the extended user data.

As described above, after step 708, the extended user data includes the original user data and any extended pre-stored bit pattern used in the dimensional folding process. In step 710, the method utilizes the matrix or submatrix selected in step 704 to encode the extended data, generating a codeword corresponding to the extended data. In one embodiment, any type of linear block encoder may be used to encode the data (e.g., an LDPC encoder).

In step 712, the method determines whether any space remains within the NAND Flash page.

As described in connection with FIG. 6, the variable codeword sizes stored within a given NAND Flash page may result in segments of the total page comprising "empty" sections. As described previously, the method may use this empty space to generate additional error checking data.

In step 714, after determining that a NAND Flash page includes extra space, the method performs an interleaved encoding procedure.

In one embodiment, the method may extract one or more extended symbols included within the NAND Flash page. As described above, an extended symbol may comprise a 2-bit segment of user data generated in step 708. That is, the extended symbols include one bit of user data and one bit of pre-stored bit data. In one embodiment, the method concatenates the extended symbols to form an extended symbol codeword. The method then inputs this extended symbol codeword into an intra-codeword encoder (e.g., an LDPC encoder) to generate a set of additional parity plus bits.

In step 716, the method reduces the Galois field dimension to encode the extended symbols with a Tanner graph.

As described in connection with FIG. 4, after encoding the extended user data in step 710 to generate the parity data of the codeword, the method extracts the extended symbols included within the extended user data. As a first step, the method removes the extended bits of the extended symbols and sets the user data in the final codeword as the original user data.

The method may then utilize the user data of the extended symbols to generate a parity extension using the Tanner graph depicted in FIG. 5 or a similar Tanner graph. In this manner, the method replaces the extended bits with a parity extension as depicted in FIG. 4.

In step 718, the method generates parity plus data of the final codeword and generates a final codeword.

Figure 8:
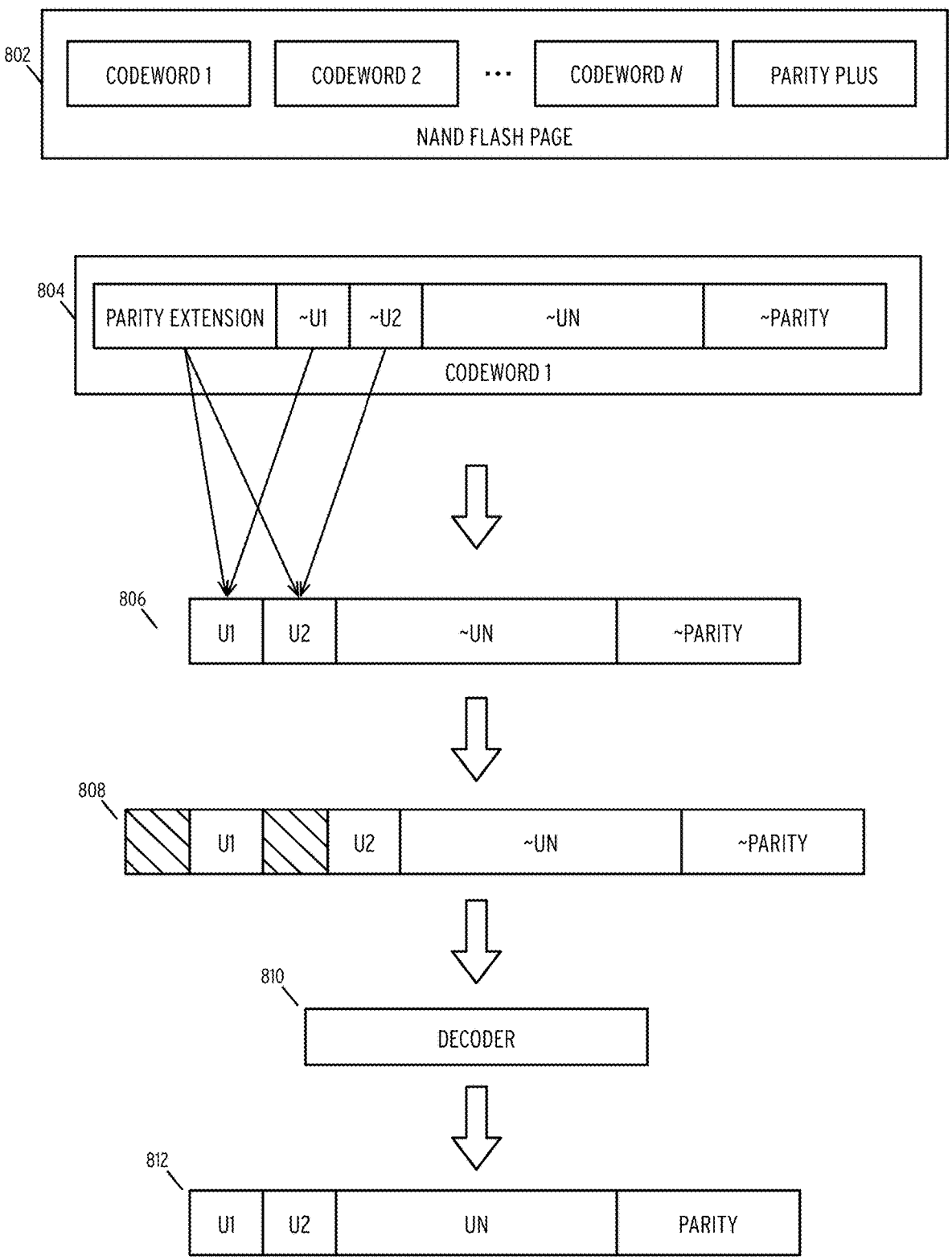
FIG. 8 is a diagram showing data transformations during a decoding procedure according to some embodiments of the disclosure.

In one embodiment, the method inserts the parity plus data generated in step 714 into the final codeword at predefined location. The method may additionally add, as a header, a parity extension generated using the reduced dimension Galois field symbols. FIG. 8 illustrates the resulting codeword.

FIG. 8 is a diagram showing data transformations during a decoding procedure according to some embodiments of the disclosure.

In the illustrated embodiment, a given NAND Flash page (802) is read in response to a read command. As illustrated, the page (802) includes a plurality of codewords and an optional parity plus data. These codewords and parity plus data are generated in accordance with the methods discussed previously.

A selected codeword (804) is illustrated in expanded detail. As discussed, a codeword (804) includes a parity extension, user bits U1, U2 . . . UN, and parity data. Each portion of the codeword (804) is marked with a tilde ("~") to indicate that each portion may have one or more errors.

In the illustrated embodiment, a first interim decoding (806) is performed using the parity extension and the U1 and U2 bits of the codeword (804). As discussed previously, bits U1 and U2 were extended using a pre-stored pattern and the user bits U1 and U2 were separately encoded to generate the parity extension data. Thus, these bits (U1 and U2) may be decoded and, if necessary, error corrected using the parity extension separate from the parity data. As illustrated, user bits UN and the parity data of interim decoding (806) may still contain one or more errors.

In the second interim decoding (808), the symbol bits (U1 and U2) are extended using the pre-stored bit patterns extracted from the parity extension data during the first decoding. Thus, second interim decoding (808) corresponds the full encoded codeword with only bits UN and the parity data potentially including errors.

The second interim decoding (808) is input into a decoder (810) such as an LDPC decoder to generate the decoded data (812).

Figure 9:
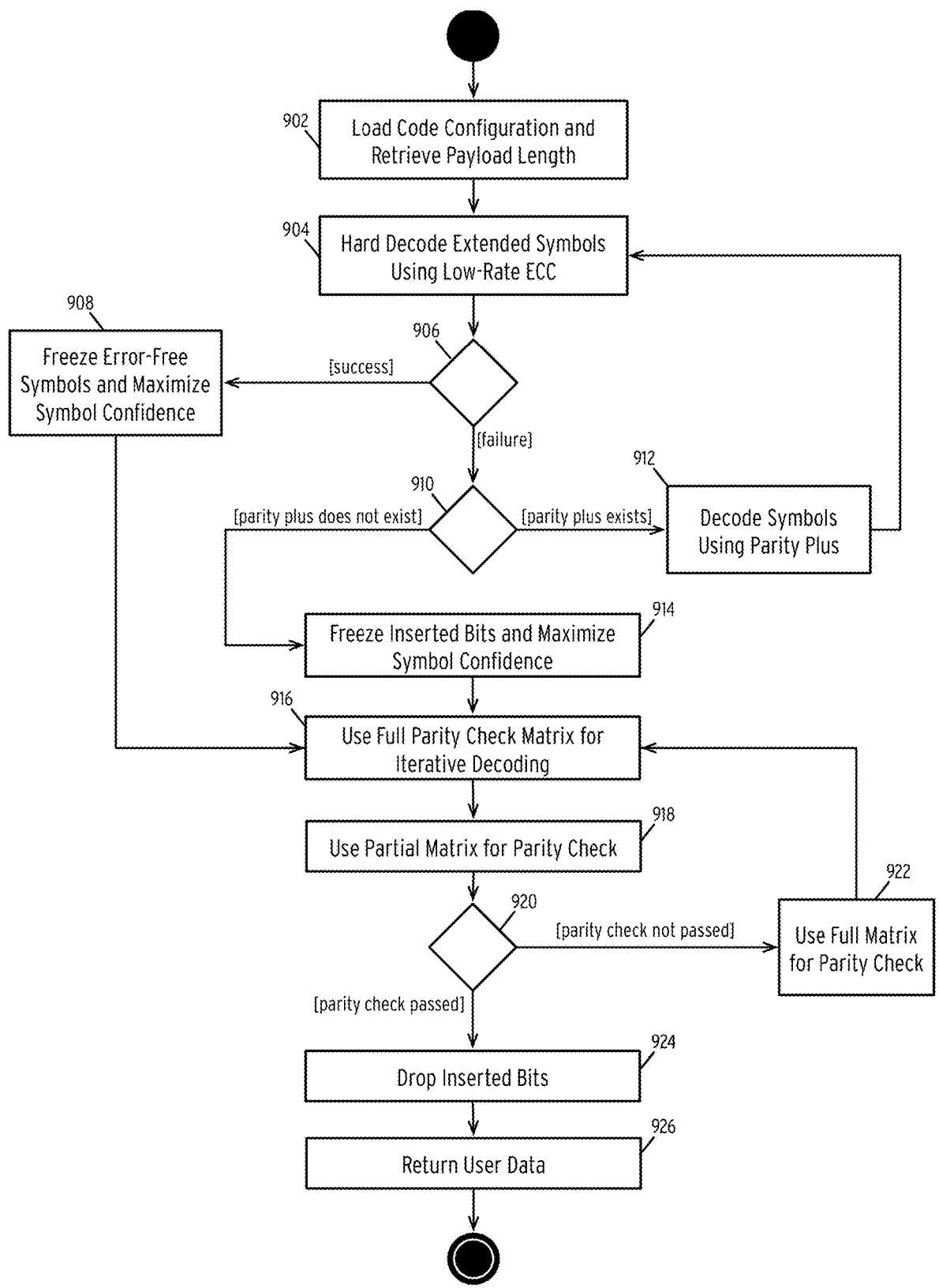
FIG. 9 is a flow diagram illustrating a read operation for a NAND Flash device according to some embodiments of the disclosure.

FIG. 9 is a flow diagram illustrating a read operation for a NAND Flash device according to some embodiments of the disclosure.

In the illustrated embodiment, the method receives a read command including an LBA of a NAND Flash device. In response, the method executes the steps illustrated in FIG. 9. In some embodiments, the illustrated method may be executed by a controller of a NAND Flash device.

In step 902, the method loads the code configuration matrices and retrieves the length of the payload at the PBA associated with the LBA. In one embodiment, the method further utilizes an FTL to generate the PBA from the LBA as discussed above. In one embodiment, the matrices include the matrices discussed in FIG. 3.

In step 904, the method performs a hard decoding using a low-rate ECC for any extended symbols.

As described above, the method may analyze a given codeword to determine if a parity extension is present and may use the parity extension to hard decode the corresponding extended user bits.

In step 906, the method determines whether the hard decoding of the extended symbols is successful (i.e., error-free). In one embodiment, the decision in step 906 may be made based on the output of the ECC decoder used to hard decode the symbols.

If the method determines that one or more extended symbols were successfully decoded, the method "freezes" the extended symbols in step 908. In one embodiment, freezing a symbol comprises preventing any changes to the symbol during subsequent decoding steps (e.g., in the event that a decoder identifies the bit of the extended symbol as containing an error). Additionally, the method sets a maximum confidence value of the extended symbol(s). As will be described, iterative soft decoders may be utilized to decode the entire codeword. Thus, the method sets the confidence of the pre-decoded symbols to, for example, one to indicate maximum confidence that the bits of the extended symbols are accurate and error-free.

In step 910, the method determines whether a parity plus data exists in the NAND Flash page. As described above, the method may analyze the entire page contents to determine whether a parity plus data for the extended symbols in the page exists.

In step 912, if the parity plus data is present in a page, the method decodes the symbols included in the page using the intra-word decoder discussed previously. In one embodiment, the method may additionally remove the parity plus data from the NAND Flash page for purposes of further processing (the parity plus data remains on the NAND Flash device). The method may then return to step 904 and attempt to decode the extended symbols again. If successfully decoding the extended symbols, the symbols are frozen and confidence maximized. Alternatively, if decoding fails again the method proceeds to check for parity plus data in step 910. Since this portion has temporarily been removed, step 910 will fail. Thus, the method will proceed to step 914.

In step 914, the method freezes inserted bits and sets the bits confidence level to a maximum value for subsequent soft-decision decoding. As described above, the inserted bits comprise a pre-stored bit pattern inserted during the GF folding procedure. Thus, while the method may not be able to decode the user bits of the extended symbol, the method may set the confidence to a maximum for the known bits inserted to generate the parity extension.

In step 916, the method uses the full parity matrix to perform iterative decoding of the codeword. As illustrated in FIG. 3, the full parity matrix may comprise the maximum-sized parity matrix. In the illustrated embodiment, the method utilizes an iterative message-passing decoding algorithm. In the illustrated embodiment, the algorithm may comprise a soft-information decoding algorithm. In one embodiment, all user data is set to a confidence of 50% with the exception of any inserted bits or extended symbols that were successfully decoded and set to have a maximum confidence value.

In step 918, the method uses a partial matrix for checking the parity of the codeword. As illustrated in FIG. 3, the partial matrix used may depend on the length of the user data and parity data as described in FIG. 3.

In step 920, the method determines if the parity check using the partial matrix has passed.

In step 922, the method determines that the parity check using the partial matrix has not passed and proceeds to perform the parity check using the full matrix as illustrated in FIG. 3.

After determining that the parity check has passed, the method drops the inserted bits in step 924. As described above, the final resulting decoded user data includes the pre-stored bit pattern. Thus, the method in step 924 removes the inserted pre-stored bit pattern to generate the final decoded user data.

In step 926, the method returns the user data after dropping the inserted bits. In some embodiments, the method may further indicate that the returned data from the page passes a CRC sanity check.

Figure 10:
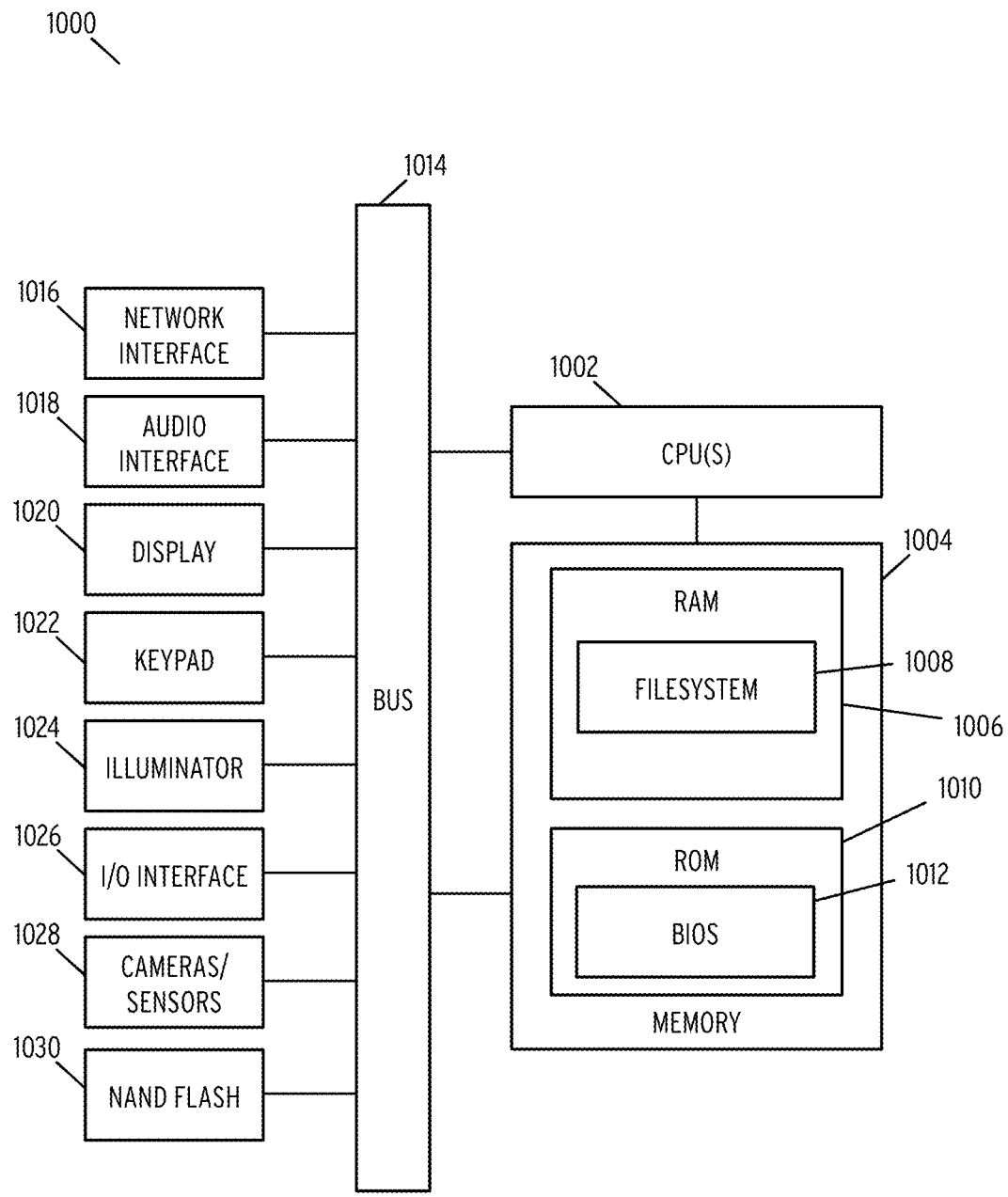
FIG. 10 is a hardware diagram illustrating a device for accessing a NAND Flash device according to some embodiments of the disclosure.

FIG. 10 is a hardware diagram illustrating a device for accessing a NAND Flash device according to some embodiments of the disclosure.

Client device (1000) may include many more or fewer components than those shown in FIG. 10. However, the components shown are sufficient to disclose an illustrative embodiment for implementing the present disclosure.

As shown in FIG. 10, client device (1000) includes processing units (CPUs) (1002) in communication with a mass memory (1004) via a bus (1014). Client device (1000) also includes one or more network interfaces (1016), an audio interface (1018), a display (1020), a keypad (1022), an illuminator (1024), an input/output interface (1026), and a camera(s) or other optical, thermal or electromagnetic sensors (1028). Client device (1000) can include one camera/sensor (1028), or a plurality of cameras/sensors (1028), as understood by those of skill in the art.

Client device (1000) may optionally communicate with a base station (not shown), or directly with another computing device. Network interface (1016) includes circuitry for coupling client device (1000) to one or more networks and is constructed for use with one or more communication protocols and technologies. Network interface (1016) is sometimes known as a transceiver, transceiving device, or network interface card (NIC).

Audio interface (1018) is arranged to produce and receive audio signals such as the sound of a human voice. For example, audio interface (1018) may be coupled to a speaker and microphone (not shown) to enable telecommunication with others and generate an audio acknowledgement for some action. Display (1020) may be a liquid crystal display (LCD), gas plasma, light emitting diode (LED), or any other type of display used with a computing device. Display (1020) may also include a touch sensitive screen arranged to receive input from an object such as a stylus or a digit from a human hand.

Keypad (1022) may comprise any input device arranged to receive input from a user. For example, keypad (1022) may include a push button numeric dial, or a keyboard. Keypad (1022) may also include command buttons that are associated with selecting and sending images. Illuminator (1024) may provide a status indication and provide light. Illuminator (1024) may remain active for specific periods of time or in response to events. For example, when illuminator (1024) is active, it may backlight the buttons on keypad (1022) and stay on while the client device is powered. Also, illuminator (1024) may backlight these buttons in various patterns when particular actions are performed, such as dialing another client device. Illuminator (1024) may also cause light sources positioned within a transparent or translucent case of the client device to illuminate in response to actions.

Client device (1000) also comprises input/output interface (1026) for communicating with external devices or other input or devices not shown in FIG. 10. Input/output interface (1026) can utilize one or more communication technologies, such as USB, infrared, Bluetooth™, or the like.

Mass memory (1004) includes a RAM (1006), a ROM (1010), and other storage means. Mass memory (1004) illustrates another example of computer storage media for storage of information such as computer-readable instructions, data structures, program modules or other data. Mass memory (1004) stores a basic input/output system ("BIOS") (1012) for controlling low-level operation of client device (1000). The mass memory may also stores an operating system for controlling the operation of client device (1000). It will be appreciated that this component may include a general purpose operating system such as a version of UNIX, or LINUX™ or a specialized client communication operating system such as Windows Client™ or the Symbian® operating system. The operating system may include, or interface with a Java virtual machine module that enables control of hardware components and operating system operations via Java application programs.

Memory (1004) further includes a filesystem (1008). In one embodiment, filesystem (1008) may comprise a standard filesystem such as ext3 or any suitable filesystem. Filesystem (1008) issues read, write, and other commands to storage devices (not illustrated). In one embodiment, the filesystem (1008) issues such commands to NAND Flash (1030). In one embodiment, NAND Flash (1030) may comprise a solid-state drive or similar device that implements one or more NAND Flash chips such as chip (304) described in the description of FIG. 1 which is incorporated by reference. In general, NAND Flash (1030) comprises any NAND Flash-based device that implements a chip such as that illustrated in FIG. 1. In one embodiment, NAND Flash (1030) may additionally include a controller device configured to manage access to and from the NAND Flash (1030). In the illustrated embodiment, this controller in the NAND Flash (1030) may perform some or all of the operations (e.g., encoding, decoding, dimension folding, etc.) discussed previously.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
    receiving a write instruction, the write instruction including user data;
    generating extended user data based on the user data, the extended user data including at least one symbol comprising a bit of the user data and a known bit, the generating comprising interleaving a pre-stored bit pattern between bits of the user data;
    generating parity data by encoding the extended user data;
    generating parity extension data by encoding the bit of the user data; and
    writing a codeword to a page of a non-volatile memory device, the codeword including the parity extension data, the user data, and the parity data, the writing comprising discarding the known bit prior to writing the codeword to the page.

2. The method of claim 1, the generating extended user data comprising generating at least one GF(4) symbol comprising the bit of the user data and the known bit.

3. The method of claim 1, further comprising identifying a required code rate associated with one of the user data or the page of the non-volatile memory device.

4. The method of claim 3, the generating parity data comprising accessing a parity matrix stored by the non-volatile memory device, the parity matrix comprising a full parity matrix or a partial parity matrix.

5. The method of claim 4, the accessing a parity matrix further comprising identifying whether to access the full parity matrix or the partial parity matrix based on the required code rate.

6. The method of claim 1, further comprising:
    identifying that the page of the non-volatile memory device includes at least one empty portion;

extracting one or more extended symbols from the page;
concatenating the one or more extended symbols;
generating parity plus data by encoding the one or more extended symbol using an intra-codeword encoder; and
including the parity plus data in the codeword prior to writing the codeword.

7. The method of claim 1, the generating a parity extension comprising encoding the extended symbol using a Tanner graph.

8. The method of claim 1, the generating extended user data based on the user data comprising interleaving the pre-stored bit pattern between bits of the user data.

9. The method of claim 1, further comprising:
retrieving a codeword from the non-volatile memory device in response to a read instruction;
identifying an extended symbol included in the codeword;
hard decoding the extended symbol to obtain a decoded extended symbol;
freezing the decoded extended symbol and setting a maximum confidence for the decoded extended symbol;
generating a decoded codeword by performing a parity check of the codeword using a partial parity check matrix, the parity check comprising an iterative soft-decision decoding process; and
generating decoded user data by dropping one or more inserted bits from the decoded codeword.

10. The method of claim 9, the hard decoding the extended symbol to obtain a decoded extended symbol further comprising:
detecting that the extended symbol could not be decoded;
identifying parity plus data in the codeword; and
decoding the extended symbol using the parity plus data of the codeword.

11. A method comprising:
retrieving a codeword from a non-volatile memory device in response to a read instruction;
identifying an extended symbol included in the codeword, the extended symbol comprising a symbol comprising a bit of user data and a known bit;
hard decoding the extended symbol to obtain a decoded extended symbol;
freezing the decoded extended symbol and setting a maximum confidence for the decoded extended symbol;
generating a decoded codeword by performing a parity check of the codeword using a partial parity check matrix, the parity check comprising an iterative soft-decision decoding process; and
generating decoded user data by dropping one or more inserted bits from the decoded codeword, the one or more inserted bits comprising a pre-stored bit pattern interleaved between bits of the user data.

12. The method of claim 11, the hard decoding the extended symbol to obtain a decoded extended symbol further comprising:
detecting that the extended symbol could not be decoded;
identifying parity plus data in the codeword; and
decoding the extended symbol using the parity plus data of the codeword.

13. A device comprising:
a processor;
a plurality of pages storing user data;
a storage medium for tangibly storing thereon program logic for execution by the processor, the stored program logic comprising:
logic, executed by the processor, for receiving a write instruction, the write instruction including user data;
logic, executed by the processor, for generating extended user data based on the user data, the extended user data including at least one symbol comprising a bit of the user data and a known bit, the generating comprising interleaving a pre-stored bit pattern between bits of the user data;
logic, executed by the processor, for generating parity data by encoding the extended user data;
logic, executed by the processor, for generating parity extension data by encoding the bit of the user data; and
logic, executed by the processor, for writing a codeword to a page of a non-volatile memory device, the codeword including the parity extension data, the user data, and the parity data, the writing comprising discarding the known bit prior to writing the codeword to the page.

14. The device of claim 11, the logic for generating extended user data comprising logic, executed by the processor, for generating at least one GF(4) symbol comprising the bit of the user data and the known bit.

15. The device of claim 13, further comprising logic, executed by the processor, for identifying a required code rate associated with one of the user data or a page of the plurality of pages.

16. The device of claim 14, the logic for generating parity data comprising logic, executed by the processor, for accessing a parity matrix, the parity matrix comprising a full parity matrix or a partial parity matrix.

17. The device of claim 15, the logic for accessing a parity matrix further comprising logic, executed by the processor, for identifying whether to access the full parity matrix or the partial parity matrix based on the required code rate.

18. The device of claim 13, the stored program logic further comprising:
logic, executed by the processor, for identifying that a page of the plurality of pages includes at least one empty portion;
logic, executed by the processor, for extracting one or more extended symbols from the page;
logic, executed by the processor, for concatenating the one or more extended symbols;
logic, executed by the processor, for generating parity plus data by encoding the one or more extended symbol using an intra-codeword encoder; and
logic, executed by the processor, for including the parity plus data in the codeword prior to writing the codeword.

19. The device of claim 13, the logic for generating a parity extension comprising logic, executed by the processor, for encoding the extended symbol using a Tanner graph.

20. The device of claim 13, the logic for generating extended user data based on the user data comprising logic, executed by the processor, for interleaving the pre-stored bit pattern between bits of the user data.

21. The device of claim 13, the stored program logic further comprising:
logic, executed by the processor, for retrieving a codeword from a page of the plurality of pages in response to a read instruction;
logic, executed by the processor, for identifying an extended symbol included in the codeword;
logic, executed by the processor, for hard decoding the extended symbol to obtain a decoded extended symbol;

logic, executed by the processor, for freezing the decoded extended symbol and setting a maximum confidence for the decoded extended symbol;

logic, executed by the processor, for generating a decoded codeword by performing a parity check of the codeword using a partial parity check matrix, the parity check comprising an iterative soft-decision decoding process; and logic, executed by the processor, for generating decoded user data by dropping one or more inserted bits from the decoded codeword.

22. The device of claim 20, the logic for hard decoding the extended symbol to obtain a decoded extended symbol further comprising:

logic, executed by the processor, for detecting that the extended symbol could not be decoded;

logic, executed by the processor, for identifying parity plus data in the codeword; and logic, executed by the processor, for decoding the extended symbol using the parity plus data of the codeword.

\* \* \* \* \*